United States Patent [19]

Parker et al.

[11] Patent Number: 5,375,148
[45] Date of Patent: Dec. 20, 1994

[54] VCO BIAS GENERATOR IN A PHASE LOCK LOOP

[75] Inventors: Lanny L. Parker, Mesa; Benjamin C. Peterson, Tempe, both of Ariz.

[73] Assignee: Motorola, Inc., Schaumburg, Ill.

[21] Appl. No.: 24,064

[22] Filed: Mar. 1, 1993

[51] Int. Cl.$^5$ .............................................. H03D 3/24
[52] U.S. Cl. .................................... 375/120; 331/10; 331/17
[58] Field of Search ................... 375/120; 331/1 A, 8, 331/10, 14, 17, 25, 34; 307/269, 296.1, 296.3, 296.4

[56] References Cited

U.S. PATENT DOCUMENTS

| | | | |
|---|---|---|---|
| 4,667,170 | 5/1987 | Lofgren et al. | 331/17 |
| 4,942,370 | 7/1990 | Shigemori | 331/1 A |
| 5,075,640 | 12/1991 | Miyazawa | 331/10 |

*Primary Examiner*—James L. Dwyer
*Assistant Examiner*—Don Vo
*Attorney, Agent, or Firm*—Robert D. Atkins

[57] ABSTRACT

A bias voltage for a VCO is generated by monitoring UP and DOWN control signals from a charge pump and generating first and second output signals upon detecting a predetermined number of consecutive UP pulses or DOWN pulses. The first output signal causes a shift register pre-loaded with a data pattern having one odd logic state to shift one bit location to left, while the second output signal moves the odd logic state one bit location to the right. The bias voltage to the VCO is selected based on the odd logic state bit location. Any variation in VCO output frequency due to intermittent ground bounce is eliminated by requiring a consecutive number of UP pulses or DOWN pulses before moving the VCO bias point.

18 Claims, 4 Drawing Sheets

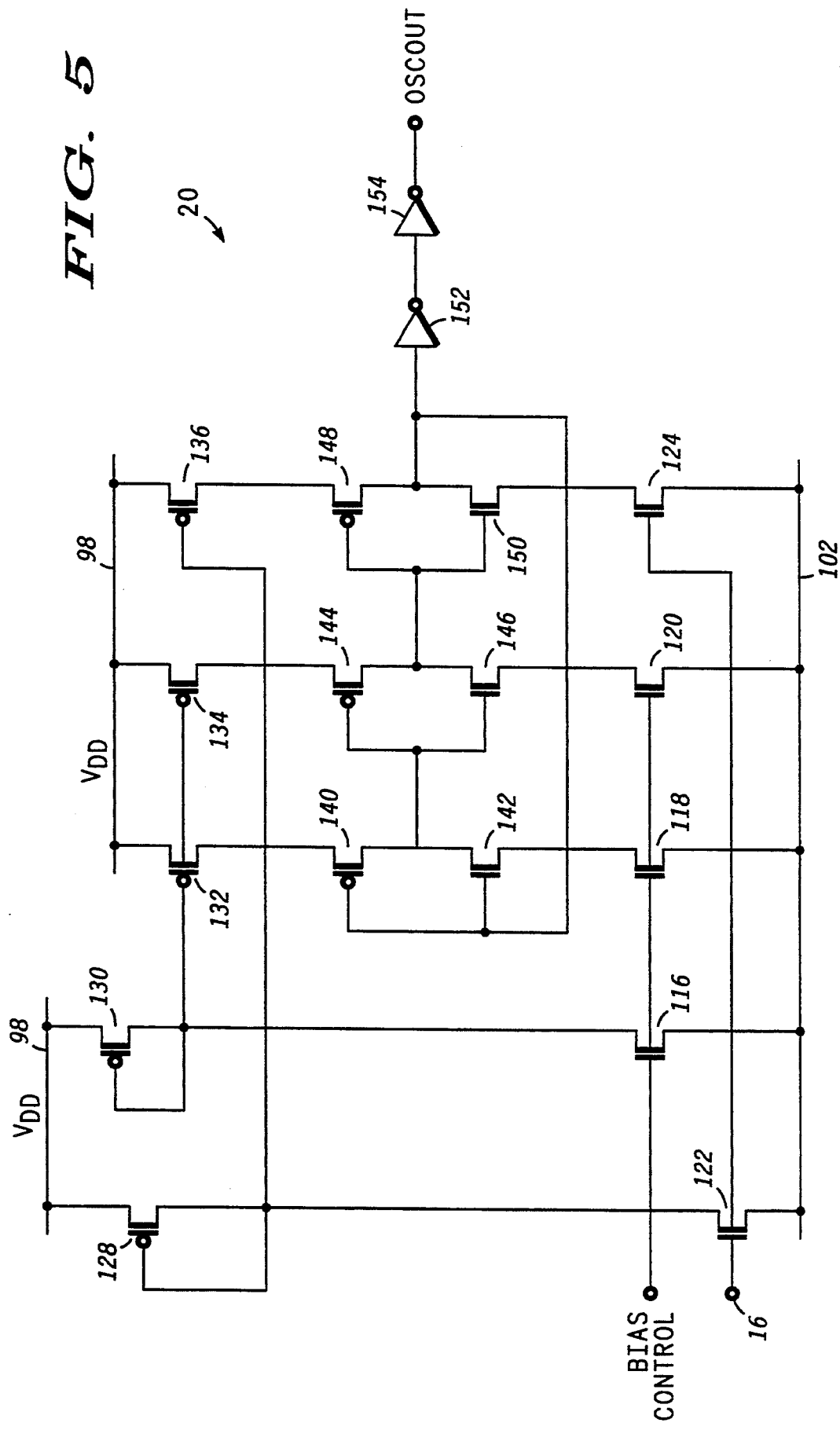

VCO BIAS GENERATOR IN A PHASE LOCK LOOP

BACKGROUND OF THE INVENTION

The present invention relates in general to phase lock loops and, more particularly, to a bias generator for a voltage controlled oscillator in a phase lock loop.

A conventional phase lock loop (PLL) generally includes a phase detector for monitoring a phase difference between an input signal and an output signal of a voltage controlled oscillator (VCO). The phase detector generates an UP control signal and a DOWN control signal for a charge pump to charge and discharge a loop filter at a loop node at the input of the V CO. The loop voltage developed across the loop filter determines the output frequency of the VCO. The UP and DOWN control Signals driving the charge pump set the proper loop filter voltage at the input of the VCO to maintain a predetermined phase relationship between the signals applied to the phase detector.

PLLs are widely used in data communications, local area networks in computer applications, microprocessors and data storage applications to control data transfers. PLLs are often implemented with Complementary Metal Oxide Semiconductor (CMOS) technology to provide low cost and low power operation allowing a system designer to extend the tracking range and frequency-aided acquisition.

A common problem related to VCO operation is ground bounce which causes undesirable UP and DOWN pulses from the phase detector and results in voltage fluctuations at the loop node. Ground bounce is typically caused by other activity on the integrated circuit such as digital bus switching. The ground bounce can induce a short duration swing, say 5 ns, in the power supply potential to the phase detector, charge pump and loop filter capacitor, which generates UP and DOWN pulses unrelated to the phase error between the input signals to the phase detector. The UP and DOWN pulses related to ground bounce cause movement in the loop node and undesired changes in VCO output frequency. The PLL must wait for the phase detector to correct for the improper VCO output frequency in its normal fashion. Unfortunately, ground bounce often results in erroneous VCO operation.

Hence, a need exists to maintain the VCO output at a frequency determined solely by the phase error to the phase detector independent of external influences like ground bounce.

SUMMARY OF THE INVENTION

Briefly stated, the invention comprises a circuit for generating a bias voltage including first means for latching first and second input signals at first and second outputs respectively, A first shift register includes a data input coupled to the first output of the first means and an output providing a first output signal when each of a plurality of bit locations contains a first logic state. A second shift register includes first and second data inputs receiving a signal having a second logic state, a plurality of bit locations pre-loaded with a data pattern having one odd logic state, and a first clock input receiving the first output signal from the first shift register for shifting the odd logic state one bit location. A second means has an input coupled to the plurality of bit locations for selecting a bias voltage based on the odd logic state bit location.

In another aspect, the present invention is a method of generating a bias voltage comprising the steps of latching first and second input signals at first and second nodes respectively, shifting bit locations of a first register upon receiving a first clock signal and loading the first input signal into a first bit location, resetting the first and second nodes, generating a first output signal from the first register when the bit locations contain a predetermined number of consecutive first input signals with a first logic state, shifting a second register pre-loaded with a data pattern having one odd logic state in response to the first output signal such that the odd logic 2state moves one bit location, and selecting a first bias voltage based on the odd logic state bit location.

BRIEF DESCRIPTION OF THE DRAWING

FIG. 5 is a schematic diagram illustrating application of the bias control signal to the VCO of FIG. 1.

DETAILED DESCRIPTION OF THE PREFERRED EMBODIMENT

Figure 1:
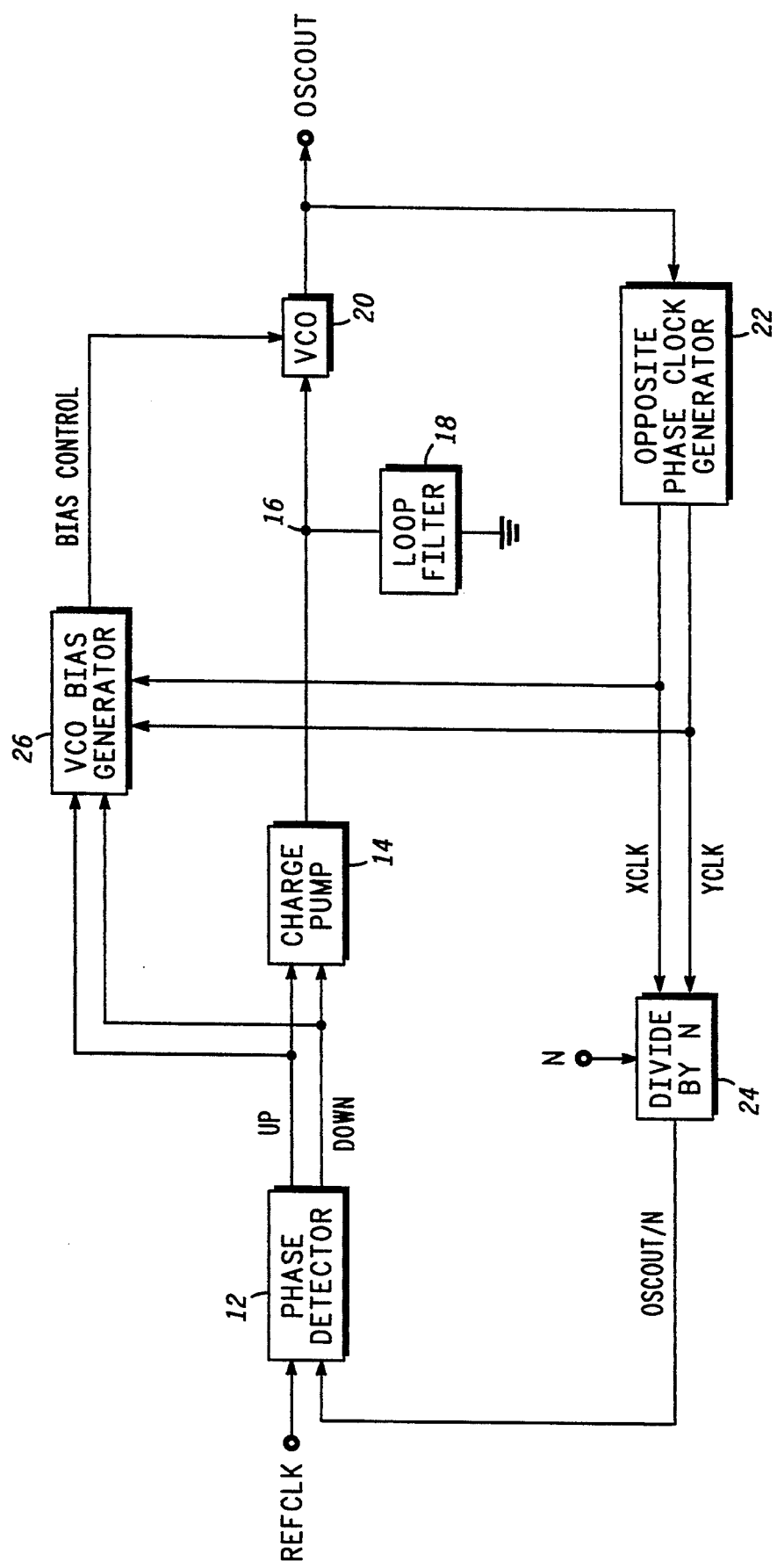
FIG. 1 is a block diagram illustrating a PLL with a VCO bias generator.

A digital PLL 10 is shown in FIG. 1 suitable for manufacturing as an integrated circuit using conventional CMOS integrated circuit processes. A digital input signal REFCLK operating at say 4.0 MHz is applied at a first input of phase detector 12 to generate an UP control signal and a DOWN control signal for charge pump 14. The output of charge pump 14 drives loop =node 16 for charging and discharging loop filter 18 comprising, for example, a capacitor (not shown) coupled between loop node 16 and ground potential. The loop voltage at loop node 16 controls VCO 20 for generating an oscillator signal OSCOUT operating at say 48 MHz. The OSCOUT signal is split into opposite phase non-overlapping XCLK and YCLK clock signals by opposite phase clock generator 22 and further frequency divided by programmable divide-by-N circuit 24 for providing an OSCOUT/N signal as applied at a second input of phase detector 12. Programmable divide-by-N circuit 24 receives an external control signal N to select the divisor N, e.g. N=12. An optional embodiment may place opposite phase clock generator 22on the output of divide-by-N circuit 24 for providing slower frequency non-overlapping clocks.

An UP control signal increases the loop voltage to increase the output frequency of VCO 20 while a DOWN control signal decreases the loop voltage to decrease the output frequency of VCO 20. The pulse width of the UP and DOWN control signals determines the amount of charge transferred to loop filter 16. The greater the phase difference between the input signal REFCLK and the OSCOUT/N signal, the greater the pulse width of the UP or DOWN control signal and the longer the charging current from charge pump 14 works to drive loop node 16 toward a voltage that alters the VCO frequency to minimize the phase difference. Thus, the mutually exclusive UP and DOWN control signals drive VCO 20 to maintain the predetermined phase relationship between the signals applied at the first and second inputs of phase detector 12.

As part of the present invention, VCO bias generator 26 receives the UP and DOWN control signals and the XCLK and YCLK clock signals for providing bias control over VCO 20. VCO bias generator 26 monitors the UP and DOWN control signals and adjusts the bias on VCO 20 upon receiving a predetermined number of consecutive UP pulses or consecutive DOWN pulses (five in the present example). For example, if VCO bias generator 26 detects five consecutive UP pulses, then the output frequency of VCO 20 must be too slow and the bias level to VCO 20 is adjusted one incremental step to increase the VCO output frequency. Conversely, if VCO bias generator 26 detects five consecutive DOWN pulses, the output frequency of VCO 20 must be too fast and the bias level to VCO 20 is adjusted one incremental step to decrease the VCO output frequency. Any UP and DOWN pulses resulting from ground bounce would most likely not continue for five consecutive pulses. Hence, ground bounce noise does not affect the VCO bias control point, only the loop node voltage.

Figure 2:
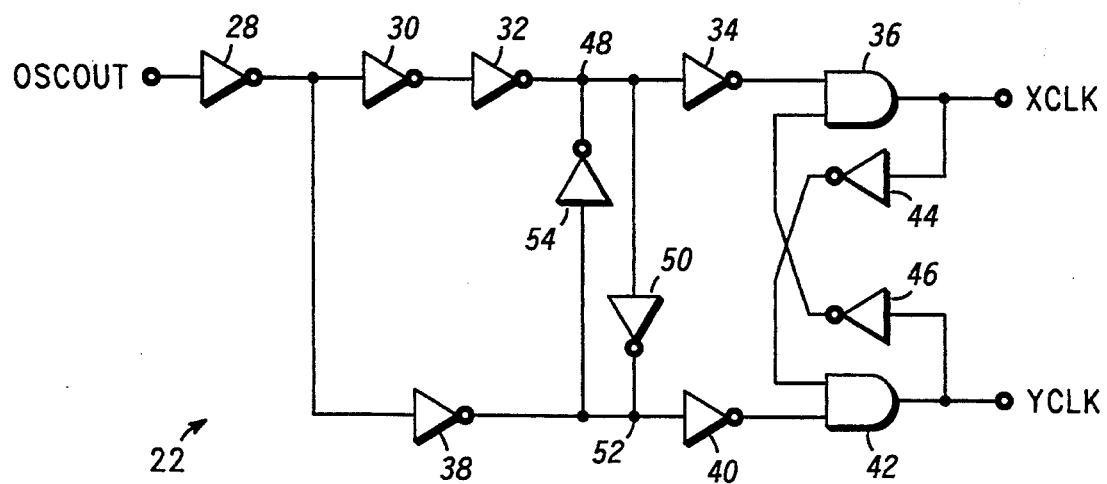
FIG. 2 is a schematic diagram illustrating the opposite phase clock generator of FIG. 1.

Opposite phase clock generator 22 is shown in FIG. 2 where the OSCOUT signal from VCO 22 is applied through inverters 28, 30, 32 and 34 to a first input of AND gate 36. The output of inverter 28 is coupled through inverters 38 and 40 to a first input of AND gate 42. The output of AND gate 36 provides the XCLK clock signal as applied through inverter 44 to a second input of AND gate 42. Likewise, the output of AND gate 42 provides the YCLK clock signal as applied through inverter 46 to a second input of AND gate 36. The output of inverter 32 at node 48 is coupled through inverter to the input of inverter 40, while the output of inverter 38 at node 52 is coupled through inverter 54 to the input of inverter 34.

When the OSCOUT signal switches to logic zero, the output of inverter 28 goes to logic one. Inverter 38 attempts to switch node 52 to logic zero before node 48 switches to logic one because node 52 is only two inverter delays away from the OSCOUT signal while node 48 is three inverter delays away. However, the transition of node 52 to logic zero is slowed by inverter 50 because node 48 is still logic zero two inverter delays after the OSCOUT signal changes to logic zero. Inverter 50 acts to hold node 52 at logic one until the output of inverter 32 changes state. A similar scenario follows when the OSCOUT signal switches to logic one. Thus, the transitions of inverters 34 and 40 overlap 180° out-of-phase and cross approximately at the 50% mark, thereby overcoming the delay difference imposed by an unequal number of inverters between the OSCOUT signal and nodes 48 and 52.

When the output of inverter 34 is logic zero, the XCLK clock signal at the output of AND gate 36 goes to logic zero. AND gate 42 receives logic ones from the outputs of inverters 44 and 40 for providing a logic one YCLK clock signal. When the output of inverter 40 goes to logic zero, the YCLK clock signal goes to logic zero. AND gate 36 receives logic ones from the output of inverters 34 and 46 for providing a logic one XCLK clock signal. Hence, the XCLK and YCLK clock signals are non-overlapping and opposite phase switching at substantially the 50% mark and operating at the frequency of the OSCOUT signal.

Figure 3:
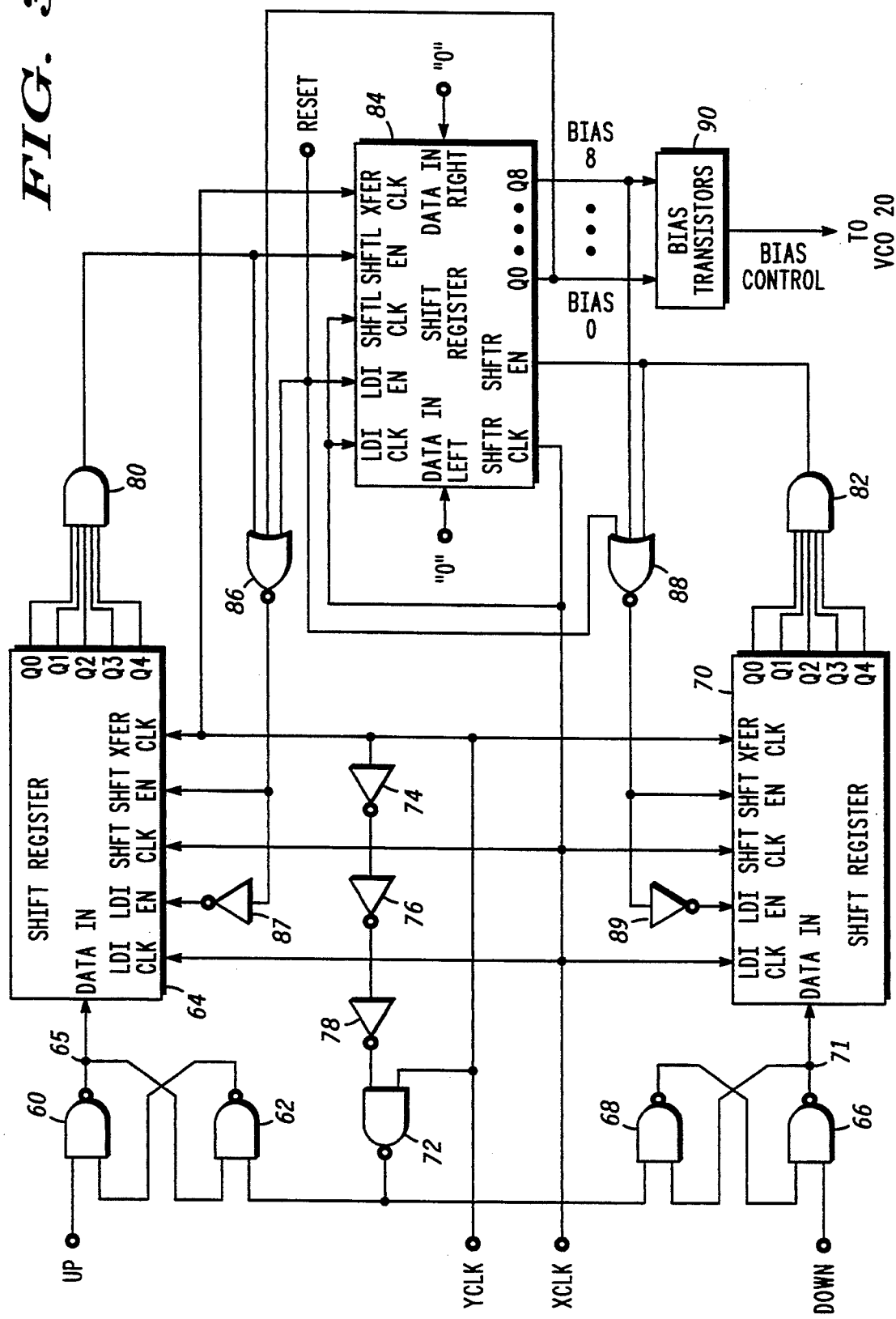
FIG. 3 is a schematic and block diagram illustrating the VCO bias generator of FIG. 1.

Turning to FIG. 3, VCO bias generator 26 is shown including NAND gates 60 and 62 arranged as a latch. NAND gate 60 receives the UP control signal from phase detector 12 and provides an output signal to the data input of 5-bit shift register 64 at node 65. NAND gates 66 and 68 are also arranged as a latch receiving the DOWN control signal and providing an output signal to the data input of 5-bit shift register 70 at node 71. The YCLK clock signal from opposite phase clock generator 22 is applied at a first input of NAND gate 72 and through inverters 74, 76 and 78 to a second input of the same. NAND gate 72 generates a logic one pulse to reset the NAND latches each YCLK cycle. Shift registers 64 and 70 are master/slave type requiring LD1 CLK and LD1 EN to load data into the master and XFER CLK to transfer the data to the slave making it available at the output. SHFT CLK and SHFT EN shifts data between adjacent bit locations. Shift registers 64 and 70 shift right only.

Initially shift registers 64 and 70 are loaded with logic zeroes in all five bit locations. When any output Q0-Q4 of shift register 64 is logic zero, the output of AND gate 80 is logic zero. Likewise, when any output Q0-Q4 of shift register 70 is logic zero, the output of AND gate 82 is logic zero. All outputs Q0-Q4 of the respective shift register must be logic one before the output of AND gate 80 or 82 switches to logic one which is the key event indicating a necessary change in the VCO bias level to increase or decrease its output frequency and correct for phase error at the inputs of phase detector 12.

Assume a logic zero UP pulse comes from phase detector 12. The UP and DOWN pulses are timed off zero-going transitions of REFCLK. The output of NAND gate 60 latches a logic one. When the LD1 CLK input receives a logic one XCLK clock signal, shift register 64 loads the logic one from its data input into the master section of the first bit location. XCLK simultaneously shifts data between bit locations by clocking SHFT CLK. The next logic one YCLK transfers data from the master section to the slave section by clocking XFER CLK. The Q0 output of shift register 64 goes to logic one.

NAND gate latch 60-62 is reset to logic zero by the logic one YCLK clock signal. At each logic one transition of the YCLK clock signal, the output of NAND gate 72 goes to logic one until the transition propagates through inverters 74-78 causing the output of NAND gate 72 to return to logic zero. If the output of NAND gate 60 had been logic one, the logic one pulse from NAND gate 72 resets it to logic zero. If no UP pulse appears during the next XCLK and YCLK clock cycle, a logic zero moves into the first bit location thereby interrupting any potential string of five consecutive logic ones. On the other hand, if a second consecutive logic zero UP pulse appears during the next XCLK and YCLK clock cycle, a second logic one is loaded into shift register 64 leaving outputs Q0 and Q1 at logic one. Three more consecutive UP pulses and the output of AND gate 80 changes state to logic one indicating it is time to move the bias point of VCO 20 and increase its output frequency. While ground bounce may cause an occasional one or two UP pulses, it is reasonable to assume that ground bounce will not cause five consecutive UP pulses and that a phase error indeed exists between the inputs of phase detector 12. Shift register 70 operates in a similar manner looking for five consecutive logic zero DOWN pulses and triggering the output of AND gate 82 upon detecting such an occurrence.

Shift register 84 keeps track of the VCO bias point with nine bit locations. Shift register 84 is master/slave type register initially pre-loaded with data pattern "000010000" having one odd logic state, i.e. the logic one in the middle bit location. The odd logic one state shifts left upon receiving a logic one from AND gate 80. The odd logic one state shifts right upon receiving a logic one from AND gate 82. The left and right data inputs of shift register 84 receive a fixed logic zero. A logic one from AND gate 80 to SHFTL EN enables shifting the bits one location to the left upon receiving the XCLK clock signal at SHFTL CLK. A logic one from AND gate 82 to SHFTR EN enables shifting the bits one location to the right upon receiving the XCLK clock signal at SHFTR CLK. The same XCLK and YCLK clock cycle activates LD1 CLK and XFER CLK and loads a logic zero into the first or last bit locations of shift register 84. Thus, after the first logic one from AND gate 80, shift register 84 contains "000100000".

Outputs Q0-Q8 of shift register 84 are labeled BIAS-0-BIAS8 for application to bias transistor circuit 90. Each bias transistor pair provides a different bias voltage to VCO 20 as per Table 1. Note only one of BIAS-0-BIAS8 control signals is logic one at a time, i.e. the odd logic one state. Hence, bias transistor circuit 90 uses BIAS0-BIAS8 to tap one transistor pair and generate the proper bias voltage for VCO 20—further discussion forthcoming.

It is necessary to reset shift register 64 back to all logic zeroes so that it can begin looking for five consecutive UP pulses again. Accordingly, the output of AND gate 80 is coupled to one input of NOR gate 86 to produce a logic zero at SHFT EN input of shift register 64. A logic one appears at LD1 EN by way of inverter 87, thereby resetting shift register 64 in preparation for five more consecutive UP pulses. If the output of AND gate 82 has gone to logic one because of five consecutive DOWN pulses, the output of NOR gate 88 would produce a logic zero at SHFT EN input of shift register 70, and a logic one at LD1 EN by way of inverter 89, thereby resetting shift register 70 to all logic zeroes. If the phase error between the inputs of phase detector 12 continues, five more UP pulses may appear indicating the need to increase the bias point of VCO 20 further. After collecting five consecutive logic ones, the output of AND gate 80 goes to logic one and initiates another shift left for shift register 84 leaving "001000000" in its nine bit locations. Another five consecutive UP pulse and another shift left leaves shift register 84 with "010000000" where BIAS1 is logic one and BIAS0 and BIAS2-BIAS8 are logic zero. When shift register 84 reaches a limit, i.e., "100000000" or "000000001", BIAS0 and BIAS8 are applied to NOR gates 86 and 88, respectively, to shut down shift registers 64 or 70 by maintaining a constant reset thereon. Furthermore, a RESET signal forces VCO bias generator 26 through NOR gates 86 and 88 to the midpoint preset bias point "000010000" with shift registers 64 and 70 reset to all logic zeroes.

The sensitivity of VCO bias generator 26 of FIG. 1 may be adjusted to match the operating environment by shortening or lengthening the number of bit locations in shift registers 64 and 70. Increasing the length of shift registers 64 and 70 makes VCO bias generator 26 more robust to multiple consecutive UP and DOWN pulses caused by ground bounce. The tracking range of VCO bias generator 26 may be adjusted by shortening or lengthening the number of bit locations in shift register 84 of FIG. 3.

Figure 4:
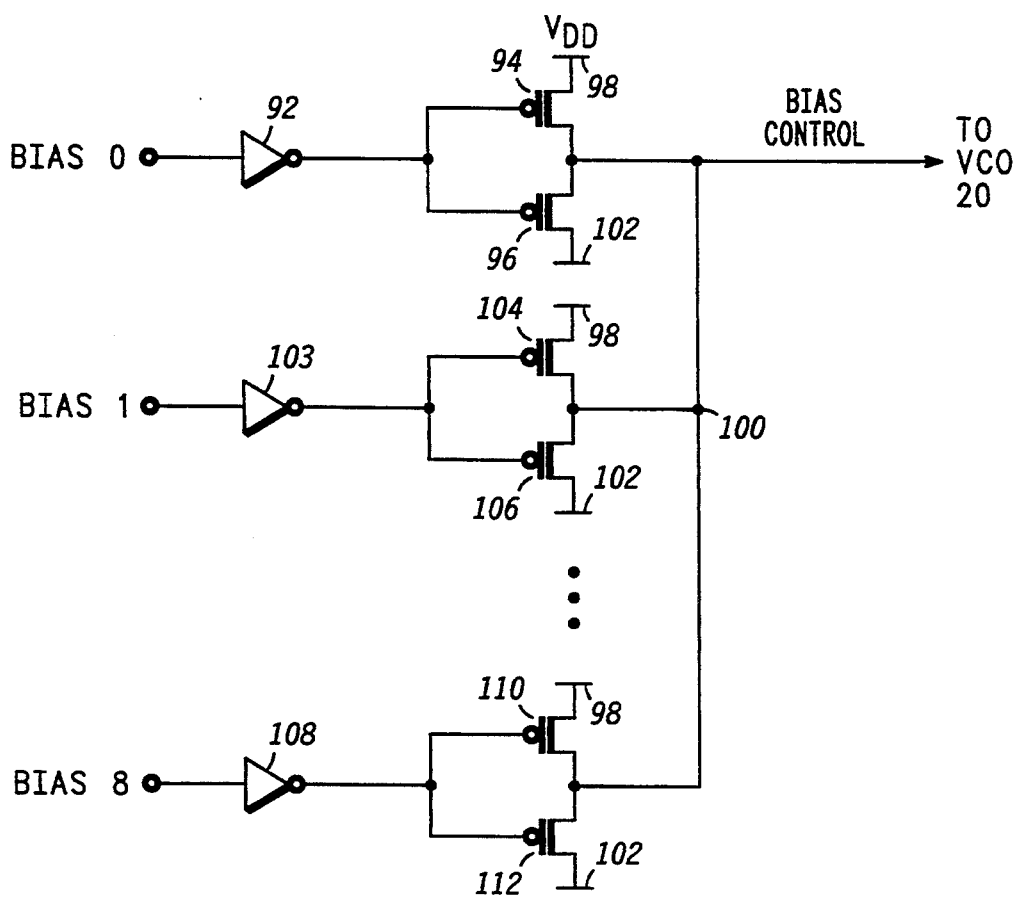
FIG. 4 is a schematic diagram illustrating the bias transistors of FIG. 3.

The BIAS0-BIAS8 control signals continue to bias transistor circuit 90 shown in FIG. 4 where BIAS0 is applied through inverter 92 to the gates of p-channel transistors 94 and 96. The source of transistor 94 is coupled to power supply conductor 98 operating at a positive power supply potential $V_{DD}$ such as 5 volts. The drain of transistor 94 and the source of transistor 96 are coupled together to node 100 for applying BIAS CONTROL to VCO 20. The drain of transistor 96 is coupled to power supply conductor 102 operating at ground potential. Similarly, BIAS1 is applied through inverter 103 to the gates of p-channel transistors 104 and 106. The source of transistor 104 is coupled to power supply conductor 98, while the drain of transistor 106 is coupled to power supply conductor 102. The drain of transistor 104 and the source of transistor 106 are coupled together to node 100. BIAS2-BIAS8 are coupled through similar transistor arrangements to node 100. For example, BIAS8 is coupled through inverter 108 and p-channel transistors 110 and 112 to node 100.

Recall that only one of the BIAS0-BIAS8 control signals is logic one at a time. In the previous example where BIAS1 ended up as logic one, inverter 103 produces a logic zero at the gates of transistors 104 and 106, turning both on and creating a resistor-divider ratio between their respective drain-source resistance paths. Referring to Table 1, transistors 104 and 106 are sized with a width/length (W/L) ratio of 10/30 and 19/6, respectively, resulting in a 2.25 volt BIAS CONTROL signal at node 100. Activating BIAS0-BIAS8 provides BIAS CONTROL signals as follows:

TABLE 1

| | upper W/L ratio | lower W/L ratio | BIAS CONTROL |
| --- | --- | --- | --- |
| BIAS0 | 10/30 | 23/6 | 2.16 |
| BIAS1 | 10/30 | 19/6 | 2.25 |
| BIAS2 | 10/30 | 15/6 | 2.36 |
| BIAS3 | 10/30 | 13/6 | 2.44 |
| BIAS4 | 10/30 | 11/6 | 2.54 |
| BIAS5 | 10/28 | 10/6 | 2.65 |
| BIAS6 | 10/24 | 10/6 | 2.75 |
| BIAS7 | 10/21 | 10/6 | 2.84 |
| BIAS8 | 10/18 | 10/6 | 2.96 |

In FIG. 5, VCO 20 is shown operating with BIAS CONTROL and the loop voltage from node 16 for controlling the output frequency of OSCOUT. The BIAS CONTROL signal is applied at the gates of transistors 116, 118 and 120, while the loop voltage from node 16 is applied at the gates of transistors 122 and 124". Transistors 128 and 130 are coupled between power supply conductor 98 and the drains of transistors 122 and 116, respectively, for developing bias voltages for transistors 132, 134 and 136 as shown. VCO 20 includes three inverting transistor pairs 140-142, 144-146 and 148-150 with the output of inverting transistor pair 148-150 coupled to the input of inverting transistor pair 140-142 causing the circuit to oscillate. Inverters 152 and 154 buffer the OSCOUT signal.

The BIAS CONTROL signal provides coarse tuning of VCO 20 in steps of approximately 10 mv as described above in Table 1. As the BIAS CONTROL signal increases, transistors 116, 118 and 120 each conduct more current. The drain voltage of transistor 116 falls thereby turning on transistors 132 and 134 harder. As a result, inverting transistor pairs 140-142 and 144-146 conduct more current and therefore switch faster. The output frequency of VCO 20 increases. A decreasing BIAS CONTROL signal reduces the current flow through inverting transistor pairs 140-142 and 144-146 and causes the output frequency of VCO 20 to fall.

The loop voltage from node 16 provides fine tuning of the output frequency of VCO 20 in response to a phase difference at the input of phase detector 12 of FIG. 1. As the loop node voltage increases, transistors 122 and 124 each conduct more current. The drain voltage of transistor 122 falls thereby turning on transistor 136 harder. Inverting transistor pair 148-150 conducts more current and switches faster causing the output frequency of VCO 20 increases. A decreasing loop node voltage reduces the current flow through inverting transistor pair 148-150 and causes the output frequency of VCO 20 to fall. The BIAS CONTROL signal provides coarse tuning control over VCO 20 because it undergoes greater magnitude changes and further because it controls two inverting transistor pairs. The loop node voltage provides fine tuning control over VCO 20 because it involves smaller magnitude changes and controls only one inverting transistor pair.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A circuit for generating a bias voltage, comprising:
   first means for latching a first input signal at a first output;
   a first shift register having a data input, an output and a first plurality of bit locations, said data input being coupled to said first output of said first means, said output providing a first output signal when each of said first plurality of bit locations contains a first logic state;
   a second shift register having first and second data inputs, a first clock input, and a plurality of bit locations, said first and second data inputs receiving a signal having a second logic state, said plurality of bit locations being pre-loaded with a data pattern having one odd logic state, said first clock input receiving said first output signal from said first shift register for shifting said odd logic state one bit location; and
   second means having an input coupled to said second plurality of bit locations for selecting the bias voltage based on said odd logic state bit location.

2. The circuit of claim 1 further comprising a third shift register having a data input, an output and a third plurality of bit locations, said data input of said third shift register being coupled to a second output of said first means for receiving a second input signal latched by said first means, said output of said third shift register providing a second output signal when each of said third plurality of bit locations contains a first logic state.

3. The circuit of claim 2 further comprising third means responsive to a first clock signal for resetting said first and second outputs of said first means to a second logic state.

4. The circuit of claim 3 wherein said first means includes:
   a first NAND gate having first and second inputs and an output, said first input of said first NAND gate receiving said first input signal, said output of said first NAND gate being coupled to said data input of said first shift register; and
   a second NAND gate having first and second inputs and an output, said first input of said second NAND gate being coupled to said third means, said second input of said second NAND gate being coupled to said output of said first NAND gate, said output of said second NAND gate being coupled to said second input of said first NAND gate.

5. The circuit of claim 4 wherein said first means further includes:
   a third NAND gate having first and second inputs and an output, said first input of said third NAND gate receiving said second input signal, said output of said third NAND gate being coupled to said data input of said third shift register; and
   a fourth NAND gate having first and second inputs and an output, said first input of said fourth NAND gate being coupled to said third means, said second input of said fourth NAND gate being coupled to said output of said third NAND gate, said output of said fourth NAND gate being coupled to said second input of said third NAND gate.

6. The circuit of claim 5 wherein said second means includes:
   a first inverter having an input and an output, said input of said first inverter being coupled to one of said second plurality of bit locations of said second shift register;
   a first transistor having a gate, a drain and a source, said gate of said first transistor being coupled to said output of said first inverter, said source of said first transistor receiving a first power supply potential; and
   a second transistor having a gate, a drain and a source, said gate of said second transistor being coupled to said output of said first inverter, said drain of said second transistor receiving a second power supply potential, said drain of said first transistor and said source of said second transistor being coupled together for providing the bias voltage.

7. The circuit of claim 6 wherein said third means includes:
   a fifth NAND gate having first and second inputs and an output, said first input of said fifth NAND gate receiving said first clock signal, said output of said fifth NAND gate being coupled to said first inputs of said second and fourth NAND gates;
   a second inverter having an input coupled for receiving said first clock signal and having an output;
   a third inverter having an input coupled to said output of said second inverter and having an output; and
   a fourth inverter having an input coupled to said output of said third inverter and having an output coupled to said second input of said fifth NAND gate.

8. A phase lock loop, comprising:
   first means for comparing a phase difference of first and second input signals and generating first and second control signals;
   a charge pump responsive to said first and second control signals for charging and discharging a loop node;
   a VCO having a control input, a bias input and an output, said control input being coupled to said loop node, said output providing an oscillator signal;

second means for dividing down said oscillator signal into said second input signal to said first means; and third means coupled for receiving said first and second control signals from said first means and generating a bias control signal to said bias input of said VCO upon detecting a predetermined number of consecutive first control signals or consecutive second control signals.

9. The phase lock loop of claim 8 wherein said third means includes:

a first latching circuit for latching said first control signal at an output;

a first shift register having a data input, an output and a first plurality of bit locations, said data input being coupled to said output of said first latching circuit, said output providing a first output signal when each of said first plurality of bit locations contains a first logic state;

a second shift register having first and second data inputs, a first clock input, and a plurality of bit locations, said first and second data inputs receiving a signal having a second logic state, said second plurality of bit locations being pre-loaded with a data pattern having one odd logic state, said first clock input receiving said first output signal from said first shift register for shifting said odd logic state one bit location; and fourth means having an input coupled to said second plurality of bit locations forms selecting a bias voltage based on said odd logic state bit location.

10. The phase lock loop of claim 9 further comprising:

a second latching circuit for latching said second control signal at an output; and a third shift register having a data input, an output and a third plurality of bit locations, said data input of said third shift register being coupled to said output of said second latching circuit, said output of said third shift register providing a second output signal when each of said third plurality of bit locations contains a first logic state.

11. The phase lock loop of claim 10 further comprising fifth means responsive to a first clock signal for resetting said outputs of said first and second latching circuits to a second logic state.

12. The phase lock loop of claim 11 wherein said first latching circuit includes:

a first NAND gate having first and second inputs and an output, said first input of said first NAND gate receiving said first input signal, said output or said first NAND gate being coupled to said data input of said first shift register; and a second NAND gate having first and second inputs and an output, said first input of said second NAND gate being coupled to said third means, said second input or said second NAND gate being coupled to said output of said first NAND gate, said output of said second NAND gate being coupled to said second input of said first NAND gate.

13. The phase lock loop of claim 12 wherein said second latching circuit includes:

a third NAND gate having first and second inputs and an output, said first input of said third NAND gate receiving said second input signal, said output of said third NAND gate being coupled to said data input of said third shift register; and a fourth NAND gate having first and second inputs and an output, said first input of said fourth NAND gate being coupled to said third means, said second input of said fourth NAND gate being coupled to said output of said third NAND gate, said output of said fourth NAND gate being coupled to said second input of said third NAND gate.

14. The phase lock loop of claim 13 wherein said fourth means includes:

a first inverter having an input and an output, said input of said first inverter being coupled to one of said second plurality of bit locations of said second shift register;

a first transistor having a gate, a drain and a source, said gate of said first transistor being coupled to said output of said first inverter, said source of said first transistor receiving a first power supply potential; and a second transistor having a gate, a drain and a source, said gate of said second transistor being coupled to said output of said first inverter, said drain of said second transistor receiving a second power supply potential, said drain of said first transistor and said source of said second transistor being coupled together for providing said bias voltage.

15. The phase lock loop of claim 14 wherein said fifth means includes:

a fifth NAND gate having first and second inputs and an output, said first input of said fifth NAND gate receiving said first clock signal, said output of said fifth NAND gate being coupled to said first inputs of said second and fourth NAND gates;

a second inverter having an input coupled for receiving said first clock signal and having an output;

a third inverter having an input coupled to said output of said second inverter and having an output; and a fourth inverter having an input coupled to said output of said third inverter and having an output coupled to said second input of said fifth NAND gate.

16. A method of generating a bias voltage, comprising the steps of:

latching a first input signal at a first node shifting first bit locations of a first register upon receiving a first clock signal and loading said first input signal into a first bit location;

resetting said first node;

generating a first output signal from said first register when said first bit locations contain a predetermined number of consecutive first input signals with a first logic state;

shifting second bit locations of a second register pre-loaded with a data pattern having one odd logic state in response to said first output signal such that said odd logic state moves one bit location; and selecting a first bias voltage based on said odd logic state bit location.

17. The method of claim 16 further comprising the steps of:

latching a second input signal at a second node;

shifting third bit locations of a third register upon receiving said first clock signal and loading said second input signal into a first bit location;

resetting said second node; and generating a second output signal from said third register when said third bit locations contain a predetermined number of consecutive second input signals with a first logic state.

18. The method of claim 17 further comprising the steps of:
shifting said second register pre-loaded with said data pattern having one odd logic state in response to said second output signal such that said odd logic state moves one bit location; and
selecting a second bias voltage based on said odd logic state bit location.

* * * * *

UNITED STATES PATENT AND TRADEMARK OFFICE
CERTIFICATE OF CORRECTION

PATENT NO. : 5,375,148
DATED      : December 20, 1994
INVENTOR(S): Lanny Parker et al.

It is certified that error appears in the above-indentified patent and that said Letters Patent is hereby corrected as shown below:

In column 7, line 41, claim 1, delete "plurality" and insert therefor --a second plurality--.

Signed and Sealed this

Thirteenth Day of June, 1995

Attest:

BRUCE LEHMAN

Attesting Officer

*Commissioner of Patents and Trademarks*